United States Patent

Van Der Laan et al.

(10) Patent No.: US 7,177,010 B2
(45) Date of Patent: Feb. 13, 2007

(54) LITHOGRAPHIC APPARATUS AND DEVICE MANUFACTURING METHOD

(75) Inventors: Hans Van Der Laan, Veldhoven (NL);
Uwe Mickan, Veldhoven (NL);
Markus Franciscus Antonius Eurlings, Tilburg (NL); Jan Bernard Plechelmus Van Schoot, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 92 days.

(21) Appl. No.: 10/979,798

(22) Filed: Nov. 3, 2004

(65) Prior Publication Data

US 2006/0092397 A1 May 4, 2006

(51) Int. Cl.
*G03B 27/42* (2006.01)
(52) U.S. Cl. ............................. 355/67; 355/69; 355/77
(58) Field of Classification Search .................. None
See application file for complete search history.

(56) References Cited

U.S. PATENT DOCUMENTS

| | | | |
|---|---|---|---|
| 5,846,678 A * | 12/1998 | Nishigori et al. ............ 355/69 |
| 6,278,514 B1 * | 8/2001 | Ohsaki ......................... 355/55 |
| 2002/0190228 A1 * | 12/2002 | Suzuki et al. ............... 250/548 |
| 2005/0148195 A1 * | 7/2005 | Koehle et al. .............. 438/709 |

* cited by examiner

*Primary Examiner*—D. Rutledge
(74) *Attorney, Agent, or Firm*—Pillsbury Winthrop Shaw Pittman LLP

(57) ABSTRACT

A lithographic apparatus comprises an illumination system for providing a projection beam of radiation, a support structure for supporting patterning device, the patterning device serving to transmit or reflect radiation in the projection beam and impart the projection beam with a pattern in its cross-section, a substrate table for holding a substrate, and a projection system for projecting the patterned beam onto a target portion of the substrate. A sensor is provided for measuring the spatial intensity distribution of the projection beam at the substrate. The spatial distribution of transmission or reflectance of the patterning device, together with the distribution of the projection beam incident on the patterning device, may be determined from the measured intensity distribution. By comparing the transmission or reflectance from regions having identical patterns the overall (macroscopic) distribution of the transmission or reflectance of the patterning device can be determined.

30 Claims, 6 Drawing Sheets

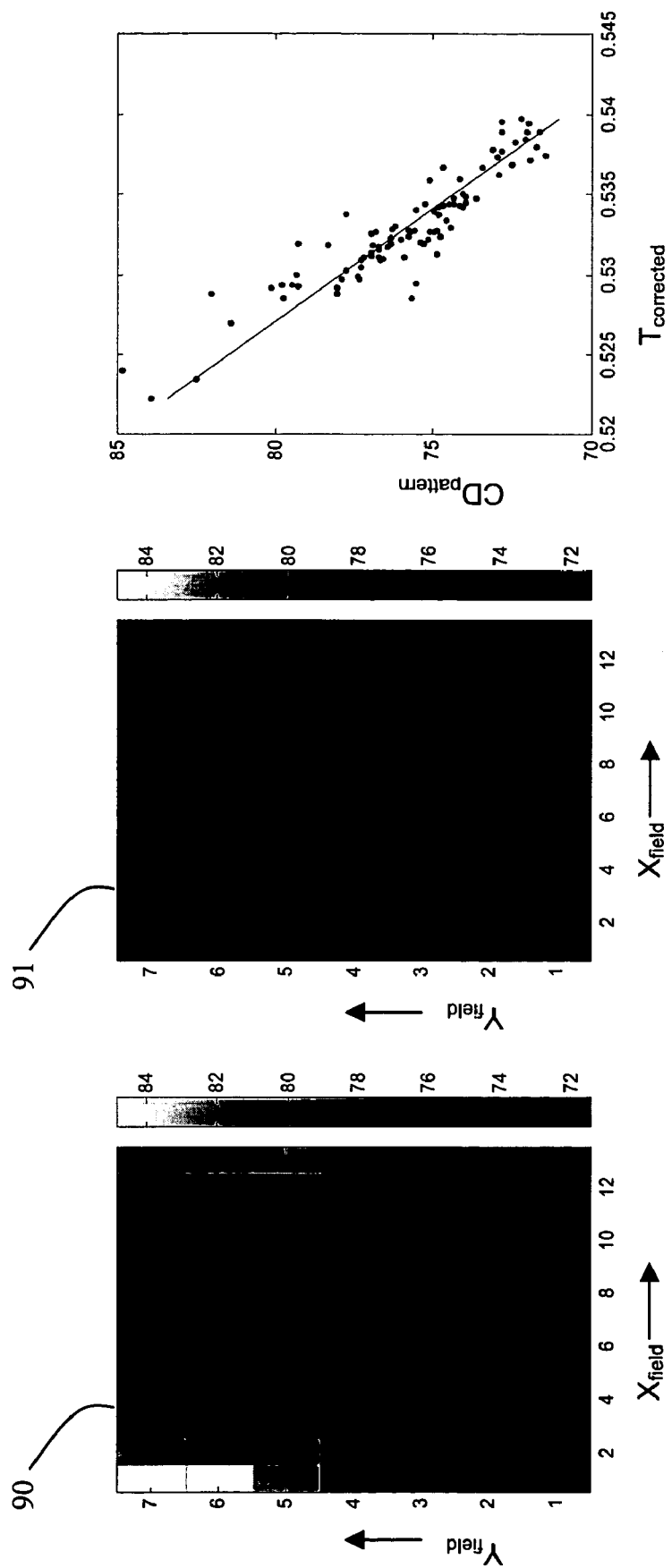

LITHOGRAPHIC APPARATUS AND DEVICE MANUFACTURING METHOD

FIELD OF THE INVENTION

The present invention relates to a lithographic apparatus and a device manufacturing method. In particular, the invention relates to a method of measuring the uniformity of transmission or reflection of a production mask.

BACKGROUND TO THE INVENTION

A lithographic apparatus is a machine that applies a desired pattern onto a target portion of a substrate. Lithographic apparatus can be used, for example, in the manufacture of integrated circuits (ICs). In that instance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Lithographic apparatus may be of the transmissive type, where radiation is passed through a mask to generate the pattern, or of the reflective type, where radiation is reflected from the mask to generate the pattern. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It is often desirable to produce a lithographic apparatus capable of resolving features as small and close together as possible. Furthermore, it is often desirable for the maximum resolution available to be uniform across the width of the target portion. The size of the smallest resolvable feature is called the critical dimension (CD). A number of parameters affect the CD at the substrate. One of these is the transmission or reflectance of the mask. If the transmission or reflectance across the mask is not uniform, then the CD across the target portion will not be uniform. Non-uniformity of the transmission or reflectance of the mask may be caused by non-uniformity in the transmission or reflectance of the mask substrate or a variation in the size of features on the mask, or a combination of both. The size of features on the mask leading to the smallest resolvable feature at the substrate gives rise to a critical dimension of the mask. It will be appreciated that, due to the magnification of the projection system, the value of the critical dimension of the mask and the critical dimension (CD) of the substrate may not be the same.

Furthermore, there may be variations in the intensity of the projection beam across the target portion, and this will also lead to a non-uniform CD distribution across the target portion.

It is possible to correct for non-uniformity of intensity in the projection beam and in the transmission or reflectance of the mask, if this non-uniformity is known, by varying the illumination dose. It is therefore desirable to measure the non-uniformities accurately. It is possible to measure the homogeneity of the spatial distribution of the projection beam of a transmissive system simply by removing the mask and utilising a spot sensor at the wafer level. However, this does not take into account the variations introduced by the mask.

It is not practical simply to remove a mask from a reflective system, although a production mask can be replaced by a "blank" mask (i.e. a mask without a pattern) to reflect the beam towards the projection system in an effort to determine the non-uniformity of the projection beam. However, this enables the measurement at wafer level of the sum of the projection beam uniformity as provided by the illumination systems and the reflection coefficient of the blank mask. The problem with this approach is that the reflection coefficient uniformity of a blank mask is generally not the same as that of a production mask, so a correction based on the uniformity of a blank mask will be suboptimal for the production mask.

It is possible to determine the uniformity of the projection beam at substrate level with a production mask in place by exposing a test wafer using a production mask in the usual way. The test wafer can then be analysed using a scanning electron microscope (SEM) to determine the CD variation across it. The CD variation can then be corrected for by varying the radiation dose. However, this procedure involves a long cycle time and generally requires off-line tooling and related data logistics. It would be desirable to measure the uniformity of the projection beam with a production mask in place, without going through the complicated procedure of exposing and analysing a test wafer.

SUMMARY OF THE INVENTION

The present invention, in one aspect, can be used to obtain a uniform critical dimension (CD) distribution across the exposure field of a target portion without the need for exposing a test wafer.

The invention may also be used to determine, or at least estimate accurately, the spatial intensity variation of the projection beam.

According to another aspect of the invention, there is provided a lithographic apparatus including an illumination system for providing a projection beam of radiation, a support structure for supporting a patterning device, the patterning device serving to transmit or reflect the projection beam and impart the projection beam with a pattern in its cross-section, a substrate table for holding a substrate, a projection system for projecting the patterned beam onto a target portion of the substrate, a sensor for measuring the spatial intensity distribution of the projection beam at the substrate level, and an analyzer configured and arranged to determine a spatial distribution of the transmission or reflectance of the patterning device and a radiation intensity of the projection beam incident on the patterning device from the measured intensity distribution at the substrate level.

The patterning device (for example, a mask) preferably includes a plurality of regions (e.g. dies) having identical patterns. The radiation intensity distribution transmitted or reflected by the patterning device may then be determined by comparing the intensity of radiation transmitted or reflected by the plurality of regions. In other words the transmission or reflectance distribution of the patterning device (in combination with the intensity distribution of the projection beam at mask level) may be determined by measuring the intensity of the projection beam at substrate level only at positions corresponding to those where identical patterns on the mask are present.

It is thus unnecessary to expose a test wafer to measure the uniformity of the projection beam and the mask. This leads to savings in the time and complexity involved in measuring the uniformity. The radiation dose applied to the substrate can be adjusted to compensate for the measured non-uniformity in the projection beam and mask.

Preferably the intensity of radiation transmitted or reflected from a measurement location within each region is measured and compared. Each measurement location should have the same co-ordinates relative to its respective region.

The intensity distribution transmitted or reflected by the patterning device may be estimated by fitting the data from each measurement location with a function (e.g. a polynomial function).

Each region in the plurality of regions having identical patterns may include a plurality of features. The intensity transmitted or reflected by a corresponding feature in each of the plurality of regions may then be compared.

The apparatus preferably includes a dose compensation system for adjusting the dose of the radiation applied to the substrate to compensate for the transmission or reflectance distribution of the patterning device and the projection beam. For example, the source energy can be adjusted, a duty cycle of the source can be adjusted, attenuating elements can be adjusted, a duration of exposure can be adjusted or the like.

It will be appreciated that non-uniformity in the transmission or reflectance of the mask may be caused by more than one effect. For example, the substrate on which the mask is grown may have a non-uniform transmission or reflectance distribution. Similarly, many masks are provided with a membrane (known as a pellicle) attached to the mask to protect against dust which may affect the transmission or reflectance. Furthermore, the uniformity of the projection beam incident on the mask will affect the intensity measured at the substrate table. The critical dimension (CD) of features on the mask also affects the transmission or reflectance, but the change in radiation dose to compensate for this is dependant on the spacing of the features. For dense lines the change in radiation dose should be about the same as the change in transmission or reflectance measured at substrate level. For semi-isolated lines the compensating change in dose needs to be larger than the change in transmission or reflectance. It is therefore desirable to separate the contribution to the measured transmission or reflectance distribution of the mask substrate and the CD of the mask.

Therefore the transmission or reflectance of a blank region of the patterning device is preferably measured so as to determine the transmittance or reflectance distribution of the mask substrate and/or pellicle. This measurement may also include a contribution caused by the spatial intensity distribution of the projection beam incident on the mask.

If the patterning device does not contain blank regions, the spatial intensity distribution of the projection beam incident on the mask can be measured by removing the patterning device. For a transmission mask the uniformity can now be measured directly with the spot sensor at wafer level. For a reflective mask, it is necessary to replace the mask by a perfectly uniform reflecting surface or, alternatively, a well calibrated reflective surface (calibrated with respect to reflection uniformity).

The contribution of the transmission or reflectance distribution of the mask substrate (and/or pellicle), and the intensity distribution of the projection beam incident on the mask, to the transmission or reflectance distribution of the patterning device may then be determined, and the CD variation of the patterning device may be identified by removing the contribution of the mask substrate, pellicle and/or incident intensity. The dose can then be compensated using this additional data.

Not all masks will have identical regions usable to determine the reflectance or transmission profile. When a mask without identical regions is used, calculations may be required to estimate the signal change due to the changed transmission, reflectance and diffraction. In order to assist with this estimation, it is preferred that the patterning device comprises a plurality of locations having known patterns, even if these patterns are not identical. It may then be possible to determine the transmission or reflectance distribution of the patterning device by comparing the intensity of radiation transmitted or reflected at the plurality of locations.

The effect of the pattern at each location on the transmission or reflectance at that location may be determined by simulation, or alternatively by prior measurement or calibration.

According to a further aspect of the invention, there is provided a device manufacturing method including providing a substrate, providing a projection beam of radiation using an illumination system, using a patterning device to transmit or reflect radiation in the projection beam and impart the projection beam with a pattern in its cross-section, projecting the patterned beam of radiation towards the substrate, measuring the spatial intensity distribution of the projection beam at substrate level, and determining the spatial distribution of transmission or reflectance of the patterning device and the radiation intensity incident on the patterning device from the measured intensity distribution at substrate level.

According to a yet further aspect of the invention, there is provided a method of determining the spatial distribution of transmission or reflectance of a patterning device in a lithographic apparatus, including, providing a projection beam of radiation using an illumination system, using the patterning device to impart the projection beam with a pattern in its cross-section, projecting the patterned beam of radiation onto a target, measuring the spatial intensity distribution of the projection beam at the target, and determining the transmission or reflectance distribution of the patterning device from the measured intensity distribution.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

FIG. 9A shows the CD variation across a wafer exposed by the mask of FIG. 8A, with no correction applied to the projection beam.

FIG. 9B shows the predicted CD variation across the wafer following a correction determined from the transmission variation of FIG. 8C.

FIG. 10 shows the correlation between the corrected transmission of a mask as measured with a spot sensor at wafer level and the CD variation of a wafer exposed by that mask.

Figure 1:
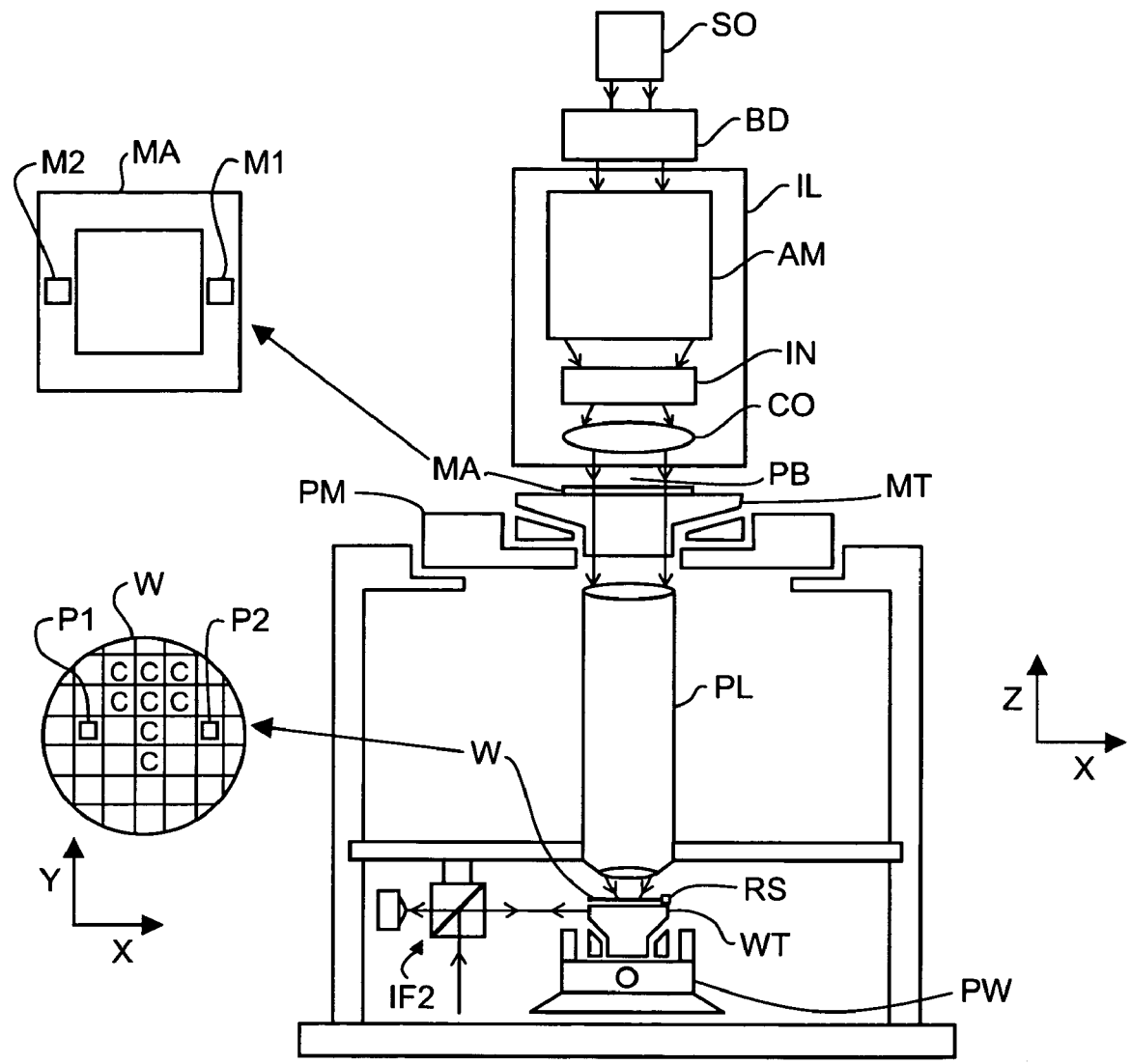
FIG. 1 depicts a lithographic apparatus having a transmissive mask.

While the invention is susceptible to various modifications and alternative forms, specific embodiments thereof have been shown by way of example in the drawings and will herein be described in detail. It should be understood, however, that this specification is not intended to limit the invention to the particular forms disclosed herein, but on the contrary, the intention is to cover all modifications, equivalents, and alternatives falling within the scope of the invention, as defined by the appended claims.

DETAILED DESCRIPTION OF THE PREFERRED EMBODIMENT

Figure 2:
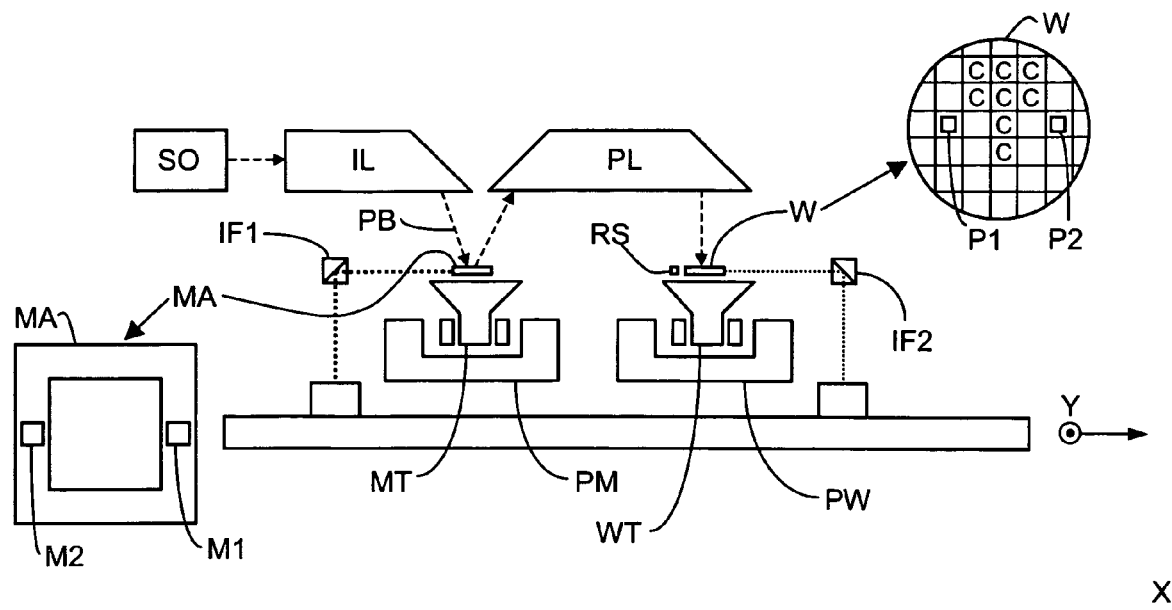
FIG. 2 depicts a lithographic apparatus having a reflective mask.

FIGS. 1 and 2 schematically depict two examples of a lithographic apparatus.

In each case the apparatus comprises:
- an illumination system (illuminator) IL for providing a projection beam PB of radiation (e.g. UV radiation).
- a first support structure (e.g. a mask table) MT for supporting patterning devices (e.g. a mask) MA and connected to first positioner PM for accurately positioning the patterning device with respect to item PL;
- a substrate table (e.g. a wafer table) WT for holding a substrate (e.g. a resist-coated wafer) W and connected to a second positioner PW for accurately positioning the substrate with respect to item PL; and
- a projection system (e.g. a refractive or reflective projection lens) PL for imaging a pattern imparted to the projection beam PB by patterning device MA onto a target portion C (e.g. comprising one or more dies) of the substrate W.

As depicted in FIG. 1, the apparatus is of a transmissive type (i.e. employing a transmissive mask). Alternatively, the apparatus may be of a reflective type (i.e. employing a programmable mirror array) as shown in FIG. 2.

The illuminator IL receives a beam of radiation from a radiation source SO. The source and the lithographic apparatus may be separate entities, for example when the source is an excimer laser, as may be the case for the transmissive apparatus of FIG. 1. In such cases, the source is not considered to form part of the lithographic apparatus and the radiation beam is passed from the source SO to the illuminator IL with the aid of a beam delivery system BD comprising for example suitable directing mirrors and/or a beam expander. In the case of the reflective system shown in FIG. 2 the source may be a plasma discharge source and a radiation collector (not shown), comprising for example suitable collecting mirrors and/or a spectral purity filter, may be used to pass the radiation beam from the source SO to the illuminator IL. In other cases the source may be integral part of the apparatus, for example when the source is a mercury lamp. The source SO and the illuminator IL, together with the beam delivery system BD or radiation collector if required, may be referred to as a radiation system.

The illuminator IL may comprise adjustable optical element, or elements, AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed (FIG. 1) or been reflected by (FIG. 2) the mask MA, the projection beam PB passes through the lens PL, which focuses the beam onto a target portion C of the substrate W. With the aid of the second positioner PW and position sensor IF2 (e.g. an interferometric device), the substrate table WT can be moved accurately, e.g. so as to position different target portions C in the path of the beam PB. Similarly, the first positioner PM and another position sensor IF1 (which is shown in FIG. 2 but not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 3:
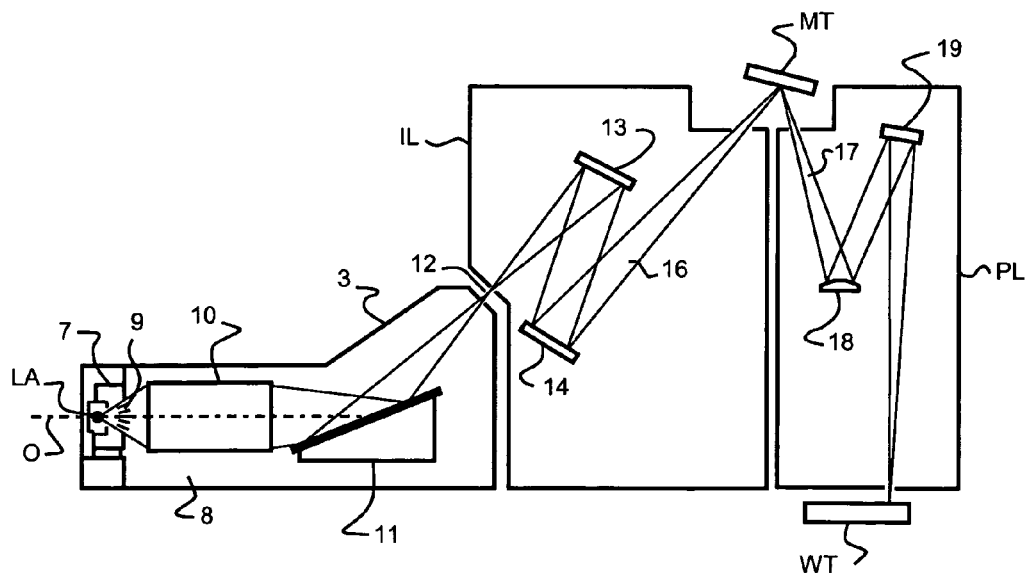
FIG. 3 depicts a lithographic apparatus suitable for use with Extreme Ultra-Violet (EUV) radiation.

FIG. 3 shows a side view of a lithographic apparatus, similar to that shown in FIG. 2, which is particularly suitable for use with EUV radiation having a wavelength in the range 5–20 nm. It comprises a source-collector module or radiation unit 3, an illumination system IL, and a projection system PL. Radiation unit 3 is provided with a radiation source LA which may employ a gas or vapour, such as for example Xe gas or Li vapour in which a very hot discharge plasma is created as to emit radiation in the EUV range of the electromagnetic radiation spectrum. The discharge plasma is created by causing a partially ionised plasma of an electrical discharge to collapse onto the optical axis O. Partial pressures of 0.1 mbar of Xe, Li vapour or any other suitable gas or vapour may be required for efficient generation of the radiation. The radiation emitted by radiation source LA is passed from the source chamber 7 into collector chamber 8 via a gas barrier structure or "foil trap" 9. The gas barrier structure comprises a channel structure such as, for instance, described in detail in European patent applications EP-A-1 233 468 and EP-A-1 057 079, which is incorporated herein by reference.

The collector chamber 8 comprises a radiation collector 10 which is formed by a grazing incidence collector. Radiation passed by collector 10 is reflected from a grating spectral purity filter 11 to be focused in a virtual source point 12 at an aperture in the collector chamber 8. From chamber 8, the projection beam 16 is reflected in illumination system IL via normal incidence reflectors 13, 14 onto a reticle or mask positioned on reticle or mask table MT. A patterned beam 17 is formed which is imaged by projection system PL via reflective elements 18, 19 onto wafer stage or substrate table WT. More elements than shown may generally be present in the illumination system IL and projection system PL.

As a result of the manufacturing process, the mask MA does not have a uniform transmission or reflectance profile across its width. This may be caused by variations in the mask substrate, or in the critical dimension (CD) of features formed on the mask. This leads to a variation in CD at the substrate W. This can be overcome by varying the radiation dose applied across the substrate W if the transmission or reflectance profile of the mask MA is known.

There are two examples of methods for determining the variation in the radiation applied to the substrate W. One of these involves placing a test wafer onto the substrate table WT and exposing this wafer using the mask MA. The test wafer is then analysed using a scanning electron microscope (SEM) to determine the CD variation across it. When a production substrate W is subsequently exposed using the same mask MA, the radiation dose is modified to correct for the measured variation in CD. This procedure is accurate but time-consuming and complicated.

The second method involves replacing the substrate W with a sensor (e.g. a spot sensor) for measuring the radiation intensity distribution at wafer level. Usually a sensor RS (see FIGS. 1 and 2) is located next to the substrate W on the substrate table WT. The substrate table is moved so that the substrate W moves out of the projection beam PB and the sensor RS moves into the projection beam to replace it. The radiation intensity is measured at positions where the pattern on the mask is identical. This makes it possible to estimate the overall transmission or reflectance profile across the full width of the mask, since the contribution of the pattern itself to the intensity at each position is identical.

Figure 4:
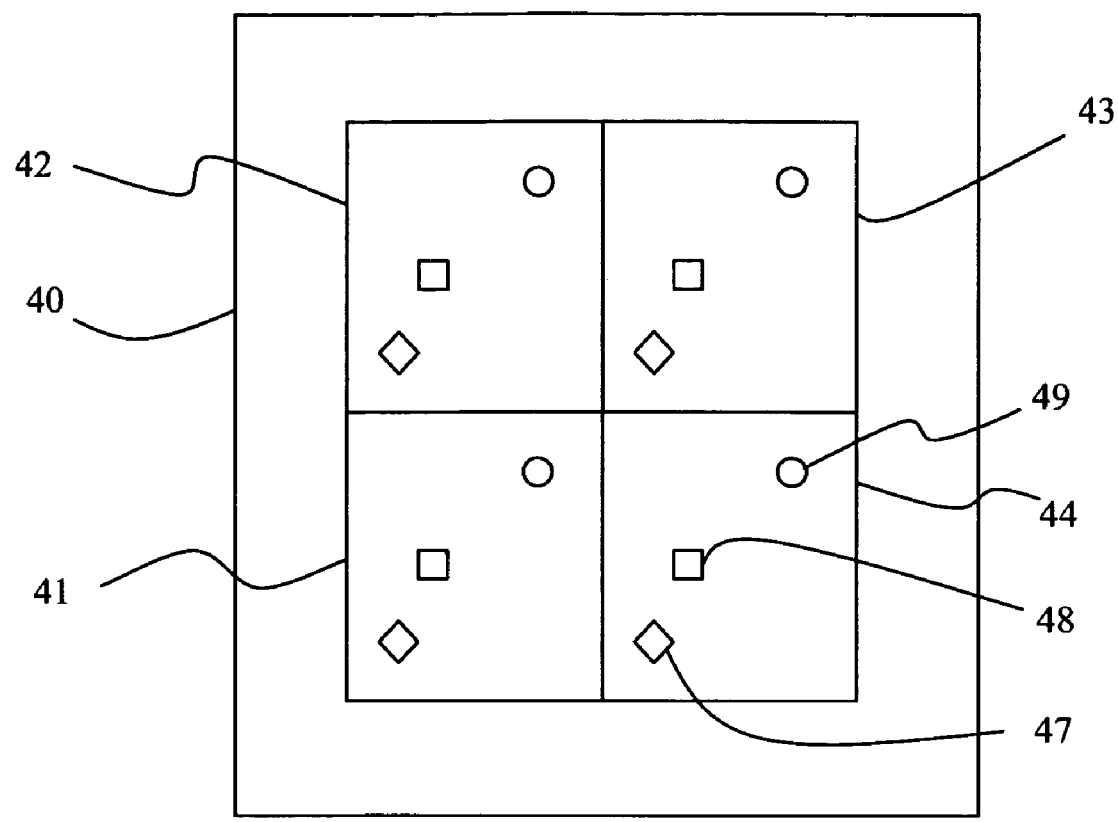
FIG. 4 is a schematic drawing of a mask having four identical dies.

FIG. 4 is a schematic drawing of a mask 40 which includes four identical dies 41, 42, 43, 44. Each die has three features, shown in FIG. 4 as a diamond 47, square 48 and circle 49. Each diamond 47 has the same co-ordinates relative to its respective die. Similarly each square 48 and each circle 49 have the same intra-die co-ordinates. In this example we can assume that the mask 40 is a transmissive mask MA similar to that shown in FIG. 1.

To determine the mask transmission the sensor RS on the substrate table WT measures the intensity of radiation transmitted at the locations of all twelve features 47, 48, 49. For a perfect mask and a uniform beam the sensor would measure the same intensity at transmitted by all locations 47 having a diamond feature. Similarly, all the squares 48 and all the circles 49 would exhibit the same transmission. Within one die, however, different intensities would be recorded for the three different features due to a different local transmission of the mask.

For a real (non-perfect) mask, as well as the different intensities within a die, the intensities between positions marked with an identical shape (e.g. diamonds 47) vary. This is the effect that needs to be corrected for.

One way of visualising this is to consider that the mask fingerprint is separated into an "intra-die" and an "inter-die" component. Separation of intra- and inter-die is only possible if more than one identical die is present on the mask. In fact, for production masks, this is almost always the case. It is only the inter-die component which will be corrected. The intra-die component, mostly resulting from pattern density variations, has too high a frequency to be corrected.

Figure 5:
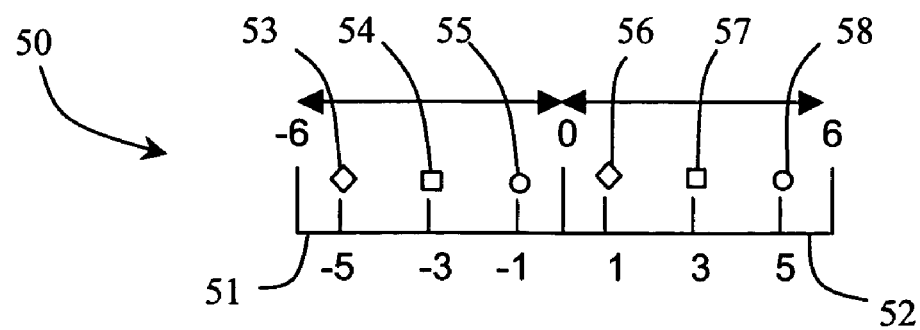
FIG. 5 is a one-dimensional representation of a mask having two identical dies.

The determination of the inter-die profile is illustrated with reference to FIG. 5, which is a schematic 1-dimensional representation of a mask 50 having two identical dies 51, 52. As with the mask shown in FIG. 4, the first die 51 contains three different features 53, 54, 55 and the second die 52 contains three features 56, 57, 58 corresponding to the features in the first die 51 and having the same intra-die co-ordinates.

Figure 6:
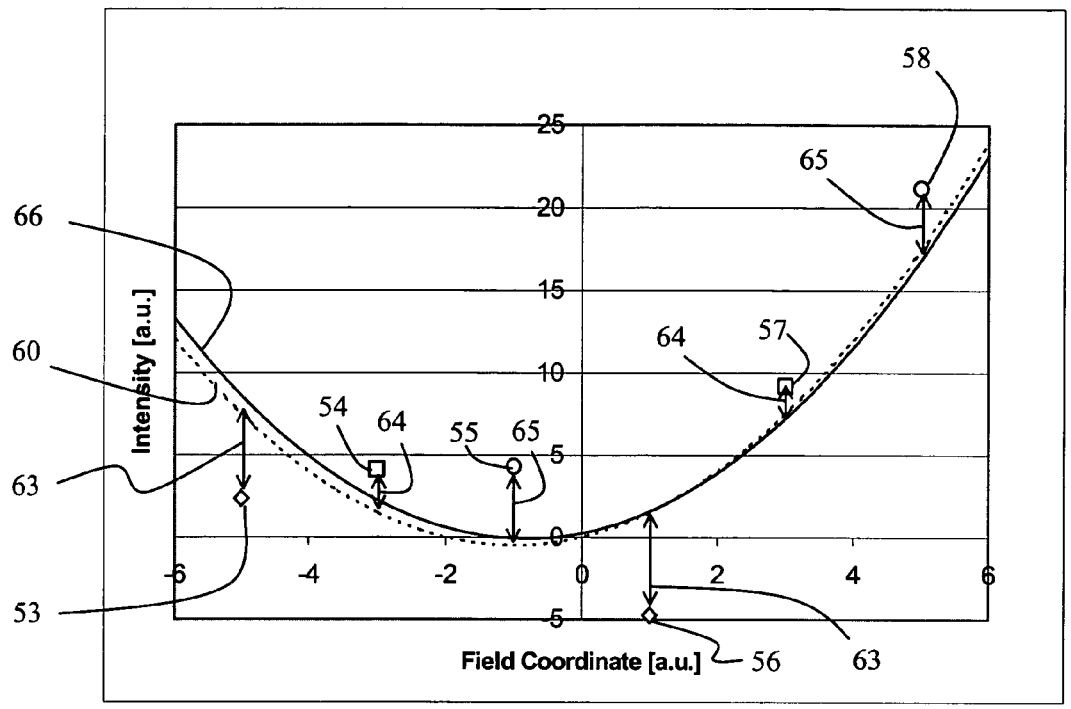
FIG. 6 is a graph showing how a simulated transmission profile can be estimated.

FIG. 6 shows how the inter-die profile is determined based on simulated data. The dashed line 60 shows the "real" intensity profile across the field, caused by non-uniformity in the intensity of radiation incident on the mask and in the transmission of the mask. Six data points 53–58 mimic the measurement of transmission at the six features 53–57.

Each point within a pair having the same intra-die coordinate (e.g. the diamonds 53, 56) will affect the transmission by the same amount. The effect on the transmission will be a scaling factor (e.g. a transmission change of 2%). This is represented in FIG. 6 by each point within a pair having the same offset 63 from the "real" intensity profile. Other pairs (e.g. the squares 54, 57 or circles 55, 58) have a different scaling factor 64, 65.

The solid line 66 is a fit through the data, with the following five fit-parameters: three scaling factors (one for each intra-die position), tilt and curvature. The figure shows that, in spite of the offsets per intra-die position, the general profile can be reproduced well. The largest deviation between the "real" line 60 and the fitted line 66 is found at the edge of the field.

Figure 7A:
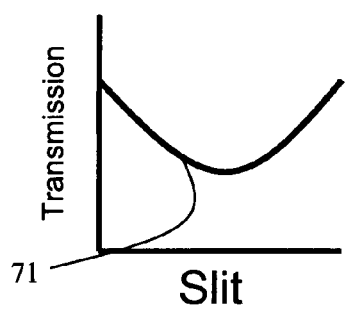
FIG. 7 shows how the radiation dose corrects for the transmission or reflectance profile of a mask.
Figure 7B:
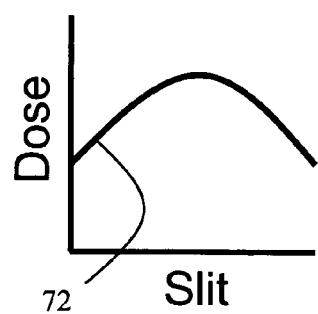
Figure 7C:
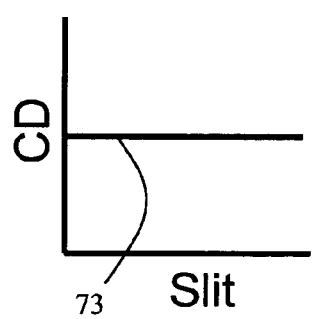

Once the transmission (or reflection) profile of the mask MA is known, it is possible to modify the radiation dose across the width of the target portion C to compensate for this when the mask is used in a lithographic apparatus. FIG. 7A shows schematically the transmission variation across the width of a transmissive mask MA. FIG. 7B shows the radiation dose 72 applied to the target portion C to compensate for this transmission variation. FIG. 7C shows the CD at the target portion C as a result. The CD at the target portion is roughly proportional to the radiation dose used, so the low radiation dose (and therefore low CD) at the edges of FIG. 7B compensates for the high transmission at the edges of the mask MA as shown in FIG. 7A. The dose may be varied by varying the intensity of the radiation, or the length of exposure, or both.

As mentioned earlier, CD variations at the substrate are caused by a number of factors, including variation in intensity across the projection beam itself, variation of the CD of the mask, variation in the transmission or reflection of the mask substrate on which the features are formed, and variation in the transmission or reflection of a thin film, or "pellicle" used to protect the mask from dust and contaminants. Variations caused by the non-uniformity of the projection beam or in the transmission or reflection of the mask substrate or pellicle can be corrected for by a direct corresponding variation in the radiation dose. Variations resulting from CD variations of the mask generally imply more complex analysis in order to determine the desired corrective variation in the radiation dose.

As an example, consider a transmissive mask having features of width 110 nm. In some regions of the mask these features are "densely" arranged with pitch 1:1, i.e. separated by 110 nm. In other regions the features are "semi-isolated" with pitch 1:3, i.e. separated by 330 nm. An aerial image simulation can be performed for such features, assuming 100% transmission through a clear area of the mask (i.e. between features), using $\lambda$=248 nm, Numerical Aperture (NA)=0.80, and Coherence ($\sigma$)=0.89/0.59. A threshold model may be used with threshold=0.3. This gives rise to the following results:

| Pitch | Region Transmission | $\Delta$Transmission (%/nm) | $dE/dCD_{ret}$(%/nm) | Factor |
|---|---|---|---|---|
| 1:1 | 0.300 | −1.52 | +1.51 | −0.99 |
| 1:3 | 0.621 | −0.44 | +1.18 | −2.68 |

"ΔTransmission" is the change in transmission of a region if the mask CD increases by 1 nm. "$dE/dCD_{ret}$" is the change in radiation dose used to compensate if the mask CD increases by 1 nm. "Factor" is given by $(dE/dCD_{ret})/(\Delta Transmission)$ and shows the factor by which the measured variation in transmission should be multiplied to give the correct corrective variation in radiation dose for that region.

It must be noted that an increase of the mask CD by 1 nm corresponds to a projection system with a magnification factor of 1. For a (standard) projection system with a magnification factor of ¼, it means a 4 nm CD increase at mask level. It will also be noted that, although a transmissive mask is referred to in this example, the same principles will apply to a reflective mask.

Furthermore it will be noted that the region transmission is not what would be expected geometrically. For example, for dense features (pitch 1:1), the region transmission would be expected from purely geometrical considerations to be 50%, rather than 30% as found in the simulation. This discrepancy occurs because the structure size is comparable to the wavelength of the light, so part of the light passing the mask is diffracted beyond the aperture of the projection lens, and will therefore not reach the wafer.

The value of 'factor' can be calculated with a lithographic simulator. Note that there is some relationship between 'transmission' and 'factor' (see table). This can be used to create a regression model for a coarse estimation of the 'factor'. Unfortunately the relationship also depends on the structure type, making simulations necessary if the 'factor' has to be known accurately.

For dense lines the table shows that ΔTransmission and $dE/dCD_{ret}$ are almost identical. If a certain transmission variation is measured across the mask this value can be immediately translated into a dose correction profile: the factor is 1. For semi-isolated lines, the factor >1. This implies a more accurate measurement of the transmission variation.

The measured transmission variation across the mask is the result not only of CD variation but also of intensity variation of the radiation incident on the patterning part of the mask. Variations can be caused by illumination non-uniformity, which can be determined by measurement without the mask in place for transmissive systems, and transmission non-uniformity of the mask substrate and/or pellicle.

In the region of the mask having dense features (pitch 1:1), if a 2% variation in transmission is measured, then it can be simply corrected by a 2% dose profile regardless of whether the source is substrate transmission variation or CD variation.

In the region of the mask having semi-isolated features (pitch 3:1), if a 2% variation in transmission is measured, the situation is more complicated. If the variation is caused by a transmission variation in the mask substrate or pellicle or a variation in illumination intensity, it should be corrected by a 2% dose profile. If the variation is caused by a CD variation it should be corrected by a 5.4% (2%×2.68) dose profile. Therefore, for proper use of this technique it is necessary to know both the overall transmission variation and the contribution of the mask substrate transmission and illumination intensity. The contribution of mask substrate transmission could be specified by the mask vendor, or measured as described below.

To measure the transmission variations of the mask substrate for optical lithography (or reflection variations of the reflective multi-layer for EUV), transmission (or reflection) measurements across "open" areas of the mask are made. Such "open" areas are those with no features, for example open areas in the scribe lane (a narrow lane between or around dies). If open areas are not available, areas should be used which are as open as possible (i.e. with as few features as possible). It will be appreciated that measurements in the "open" areas of the mask will also capture variations in the illumination of the mask in addition to variations in the transmission or reflectance of the mask substrate and/or pellicle. It is then possible to de-couple the effect of mask CD variation from transmission/reflection variation and illumination variation.

Some masks are known as attenuated phase shift masks, and incorporate 'dark' structures having a transmission of ~6%. For such masks the transmission variation of the attenuation layer should be measured across the mask, preferably in 'dark' areas (e.g. in the scribe lane), or areas that have as few bright structures as possible.

It will be appreciated that not all masks will contain sufficient identical regions, as shown in FIG. 4, to enable the estimation of the overall transmission or reflectance profile together with the intensity profile of the projection beam. For such masks it may still be possible to determine the profile using a sensor at wafer level, using calculation or calibration.

It is possible to calculate expected local transmission or reflectance values using the aerial image calculation part of a commercially available lithographic simulator such as LithoCruiser™. A part of the mask design file with the same area size as that of the sensor at wafer level is used a input for the simulator. By further entering the NA of the projection lens and the illumination setting, and possibly other machine and mask characteristics, the simulator can calculate the expected average intensity over that area.

For a mask which does not contain identical features at multiple field positions, the intensity at wafer level (with mask loaded) is measured at many locations. The measured intensity variation is the result of variations to be corrected and variations caused by the different patterns at different locations on the mask. The variations caused by different patterns, which have been estimated by the simulator as described above, can be removed mathematically. The remaining effects are caused by the macroscopic transmission or reflectance profile of the mask and the intensity profile of the projection beam incident on the mask and can then be used for correction.

Although the simulator can estimate intensity differences caused by different patterns, the accuracy may not be sufficient. A possible cause for this insufficient accuracy is the angular sensitivity of the sensor. This sensor property can be measured in a test set-up. It can be beneficial to use a different NA and illumination setting for the mask measurements than for imaging in resist. For example, the use of small NA and low σ (partial coherence) will result in relatively small angles of incidence on the sensor. For smaller angles the change in angular sensitivity is less pronounced, which improves the accuracy.

Alternatively, or additionally, an empirical approach is possible by using calibration measurements. A test mask containing the different patterns employed on the production mask may be used to determine the local transmission/reflection behaviour of each pattern. The test mask would need to have very good overall transmission/reflection characteristics, and would need to be illuminated by a scanner with a very good illumination uniformity. The simplest way to achieve this is to ensure that the relevant patterns in the test mask are next to each other in order to minimise the effect of gradual variations across the mask (caused by processing inhomogenieties during mask fabrication). This approach also limits illumination intensity variations over this small area. If the test mask is not perfect, the mask CD can be measured directly (e.g. by analysis with a SEM).

Following calibration the contributions of individual patterns to the overall transmission or reflection characteristics can be removed, as before, when correcting for non-perfect masks containing similar patterns.

Figures 8A, 8B, 8C:
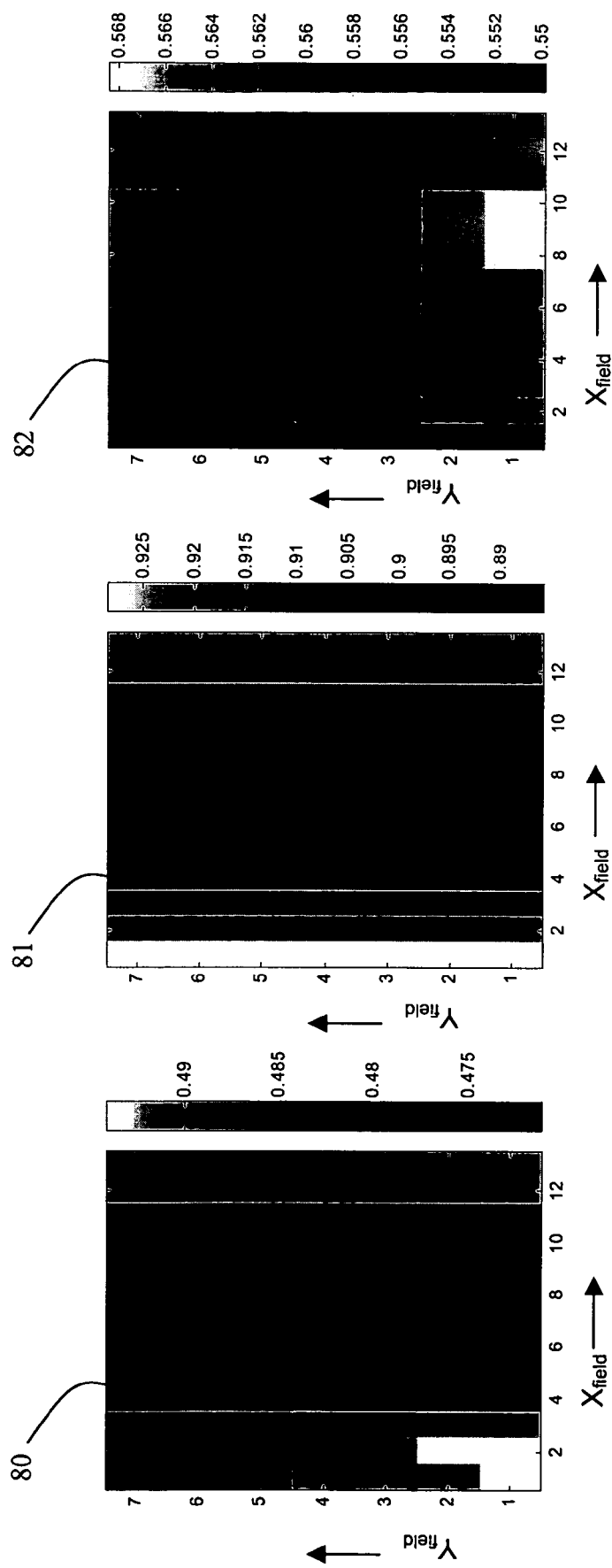
FIG. 8A is a representation of the transmission variation of regions of a mask, measured through identical patterns in each region.
FIG. 8B is a representation of the transmission variation of the regions of the mask of FIG. 8A, measured through blank areas of the mask.
FIG. 8C is a representation of the corrected transmission of the mask of 8A, with the contributions of the variation measured through the blank areas removed.

The effect of applying transmission and CD measurements using a real mask can be seen in FIGS. 8 to 10. FIG. 8A is a representation 80 of the transmission of regions of a mask, each having an identical pattern, measured by a spot sensor at wafer level. The transmission ($T_{pattern}$) shown in FIG. 8A is measured for the identical patterns in each region, as described above with reference to FIGS. 4 to 6. The pattern in each region includes dense lines which print to a CD of 80 nm at wafer level.

FIG. 8B is a representation 81 of the transmission ($T_{blank}$) through blank regions of the mask. This transmission variation is caused by non-uniformity of the mask substrate and of the projection beam incident on the mask.

FIG. 8C is a representation 82 of $T_{pattern}$ divided by $T_{blank}$ (normalised). In this representation, the effect of the non-uniformity of the mask substrate and the projection beam has been removed from the overall transmission variation. The transmission variation 82 is therefore caused only by the CD variation of the mask patterns. This can be verified with reference to FIG. 9.

FIG. 9A is a representation 90 of the CD variation ($CD_{pattern}$) measured across a wafer which has been exposed by the mask of FIG. 8, with no correction applied to the projection beam. It is apparent from the figure that there is considerable variation in the CD across the mask. The CD has a variation (3σ) of 8.12 nm. It will also be noted that the general pattern of $CD_{pattern}$ appears to be the reverse of $T_{corrected}$ shown in FIG. 8C (this is confirmed in FIG. 10).

FIG. 9B is a representation 91 of the predicted CD variation ($CD_{corrected}$) across the wafer, generated by mathematically correcting the real CD values ($CD_{pattern}$) from FIG. 9A using the mask transmission measurements ($T_{corrected}$) from FIG. 8C. The CD variation (3a) is much reduced to 3.25 nm.

FIG. 10 shows the correlation between $CD_{pattern}$ from FIG. 9A (as measured by exposing a wafer) and $T_{corrected}$ from FIG. 8C (as measured using a spot sensor and employing a method in accordance with the present invention). It is apparent that there is a close correlation between the CD variation contribution to transmission variation measured using a spot sensor and the real CD variation across the mask.

While specific embodiments of the invention have been described above, it will be appreciated that the invention may be practiced otherwise than as described. The description is not intended to limit the invention.

The invention claimed is:

1. A lithographic apparatus comprising:
an illumination system configured to condition a beam of radiation;
a support structure configured to support a patterning device, the patterning device serving to impart the beam of radiation with a pattern in its cross-section;
a substrate table configured to hold a substrate;
a projection system configured to project the patterned beam of radiation onto a target portion of the substrate;
a sensor configured to measure a spatial intensity distribution of the patterned beam at the substrate level; and
an analyzer to determine a spatial distribution of transmission or reflectance of the patterning device and an intensity distribution of the beam of radiation incident on the patterning device based on the measured spatial intensity distribution at the substrate level.

2. The apparatus of claim 1, wherein the patterning device comprises a plurality of regions having substantially identical patterns, and wherein the analyzer is arranged to determine the radiation intensity distribution transmitted or reflected by the patterning device by comparing the intensity of radiation transmitted or reflected by the plurality of regions.

3. The apparatus of claim 2, wherein the analyzer is arranged to compare the intensity of radiation transmitted or reflected from a measurement location within each region, each measurement location having the same co-ordinates relative to its respective region.

4. The apparatus of claim 3, wherein the analyzer is arranged to estimate an intensity distribution transmitted or reflected by the patterning device by fitting data from each measurement location with a function.

5. The apparatus of claim 2, wherein each of the plurality of regions includes a plurality of features, and wherein the analyzer is arranged to compare the intensity transmitted or reflected by a corresponding feature in each of the plurality of regions.

6. The apparatus of claim 2, wherein each of the regions corresponds to a die.

7. The apparatus of claim 1, wherein the spatial distribution of the radiation reflected or transmitted by the patterning device includes a component caused by the spatial distribution of the projection beam incident on the patterning device and a component caused by the spatial distribution of the reflectance or transmission of the patterning device.

8. The apparatus of claim 1, further comprising a dose compensation system configured to adjust a dose of the radiation applied to the substrate to compensate for the transmission or reflectance distribution of the patterning device and the radiation intensity distribution incident on the patterning device.

9. The apparatus of claim 1, wherein the patterning device is formed on a mask substrate, and wherein the sensor is configured to measure the transmission or reflectance of one or more blank regions of the patterning device so as to determine the transmittance or reflectance distribution of the mask substrate in combination with the intensity distribution of the projection beam incident on the patterning device.

10. The apparatus of claim 9, wherein the analyzer the contribution of the transmission or reflectance distribution of the mask substrate and the intensity distribution of the projection beam incident on the patterning device to the distribution of the radiation intensity transmitted or reflected by the patterning device.

11. The apparatus of claim 10, wherein the analyzer is arranged to determine a critical dimension (CD) distribution of the patterning device by removing the contributions of the mask substrate and projection beam incident on the patterning device.

12. The apparatus of claim 11, further comprising a dose compensation system configured to adjust a dose of the radiation applied to the substrate to compensate for the CD distribution of the patterning device.

13. The apparatus of claim 1, wherein the patterning device comprises a plurality of areas having known patterns, and wherein the analyzer is arranged to determine the transmission or reflectance distribution of the patterning device by comparing the intensity of radiation transmitted or reflected by the plurality of areas.

14. The apparatus of claim 13, wherein the effect of the pattern at each area on the transmission or reflectance at that area is determined by simulation.

15. The apparatus of claim 13, wherein the effect of the pattern at each area on the transmission or reflectance at that area is determined by measurement.

16. A method comprising:
    patterning a beam of radiation with a pattern in its cross-section;
    projecting the patterned beam of radiation;
    measuring a spatial intensity distribution of the patterned beam of radiation at a substrate level; and
    determining a spatial distribution of transmission or reflectance of a patterning device used in the patterning and a radiation intensity incident on the patterning device based on the measured intensity distribution at a substrate level.

17. The method of claim 16, wherein the patterning device comprises a plurality of regions having substantially identical patterns, the method further comprising determining the transmission or reflectance distribution of the patterning device and the radiation intensity incident on the patterning device by comparing the intensity of radiation transmitted or reflected by the plurality of regions.

18. The method of claim 17, further comprising comparing the intensity of radiation transmitted or reflected from a measurement location within each region, each measurement location having the same co-ordinates relative to its respective region.

19. The method of claim 18, further comprising estimating an intensity distribution for the patterning device and projection beam by fitting the data from each measurement location with a function.

20. The method of claim 17, wherein each of the plurality of regions includes a plurality of features, the method further comprising comparing the intensity transmitted or reflected by a corresponding feature in each of the plurality of regions.

21. The method of claim 17, wherein each of the regions corresponds to a die.

22. The method of claim 16, further comprising adjusting a dose of the radiation applied to a substrate to compensate for the transmission or reflectance distribution of the patterning device and intensity distribution of the projection beam incident on the patterning device.

23. The method of claim 16, wherein the patterning device is formed on a mask substrate, the method further comprising measuring the transmission or reflectance of a blank region of the patterning device so as to determine the transmittance or reflectance distribution of the mask substrate.

24. The method of claim 23, further comprising determining the contribution of the transmission or reflectance distribution of the mask substrate and projection beam to the distribution of radiation reflected or transmitted by the patterning device.

25. The method of claim 24, further comprising determining a critical dimension (CD) distribution of the patterning device by removing the contribution of the mask substrate and projection beam.

26. The method of claim 25, further comprising adjusting a dose of the radiation applied to a substrate to compensate for the CD distribution of the patterning device.

27. The method of claim 16, wherein the patterning device comprises a plurality of areas having known patterns, the method further comprising determining the transmission or reflectance distribution of the patterning device by comparing the intensity of radiation transmitted or reflected by the plurality of areas.

28. The method of claim 27, wherein the effect of the pattern at each area on the transmission or reflectance at that area is determined by simulation.

29. The method of claim 27, wherein the effect of the pattern at each area on the transmission or reflectance at that area is determined by measurement.

30. A method of determining the spatial distribution of transmission or reflectance of a patterning device in a lithographic apparatus, comprising:
    providing a beam of radiation using an illumination system;
    using a patterning device to impart the beam with a pattern in its cross-section;
    projecting the patterned beam of radiation;
    measuring a spatial intensity distribution of the patterned beam of radiation at a substrate level; and
    determining a distribution of the transmission or reflectance of the patterning device and the radiation intensity incident on the patterning device based on the measured intensity distribution.

* * * * *